(12) United States Patent
Kuriyama

(10) Patent No.: US 7,848,160 B2
(45) Date of Patent: Dec. 7, 2010

(54) SEMICONDUCTOR STORAGE DEVICE AND METHOD FOR OPERATING THE SAME

(75) Inventor: Masao Kuriyama, Yokohama (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 84 days.

(21) Appl. No.: 12/333,884

(22) Filed: Dec. 12, 2008

(65) Prior Publication Data

US 2009/0201749 A1    Aug. 13, 2009

(30) Foreign Application Priority Data

Dec. 13, 2007   (JP)   .............................. 2007-322198
Oct. 1, 2008   (KR)   .............................. 2008-96696

(51) Int. Cl.
*G11C 7/22*   (2006.01)
*G11C 16/06*   (2006.01)
*G11C 7/02*   (2006.01)

(52) U.S. Cl. ............................. 365/189.15; 365/185.21; 365/202; 365/208

(58) Field of Classification Search ................. 365/208, 365/189.15
See application file for complete search history.

(56) References Cited

U.S. PATENT DOCUMENTS

| 5,675,535 | A  | * | 10/1997 | Jinbo ...................... 365/185.2 |
| 5,754,486 | A  | * | 5/1998  | Nevill et al. ................ 365/201 |
| 7,123,510 | B2 | * | 10/2006 | Kojima et al. .......... 365/189.15 |
| 7,184,343 | B2 | * | 2/2007  | Kamata et al. ............... 365/205 |
| 2007/0206428 | A1 | * | 9/2007 | Bae et al. ..................... 365/193 |

FOREIGN PATENT DOCUMENTS

JP     2002-008386     11/2002

\* cited by examiner

*Primary Examiner*—Son L Mai
(74) *Attorney, Agent, or Firm*—Myers Bigel Sibley & Sajovec, PA

(57) ABSTRACT

A semiconductor storage device includes a plurality of memory cells connected to first and second column trees, and a sensing circuit reading data from the memory cells. The sensing circuit performing a read operation by electrically connecting the column tree, which is connected to a read-selected memory cell, to a sensing node and electrically connecting the column tree, which is connected to a non-selected memory cell, to a reference sensing line.

13 Claims, 5 Drawing Sheets

SEMICONDUCTOR STORAGE DEVICE AND METHOD FOR OPERATING THE SAME

CROSS-REFERENCE TO RELATED APPLICATIONS

This U.S. non-provisional patent application claims priority under 35 U.S.C. §119 of Japanese Patent Application No. 2007-322198, filed on Dec. 13, 2007 and Korea Patent Application No. 2008-96696, the entire contents of which are hereby incorporated by reference.

BACKGROUND OF THE INVENTION

The present invention disclosed herein relates to a semiconductor storage device and a method for operating the same.

As disclosed in Japanese Patent Laid-open Publication No. 2002-8386 (hereinafter, referred to as a cited document 1), one of a plurality of bit lines constituting a memory array in a nonvolatile semiconductor memory is selectively connected to one of main bit lines, and one of a plurality of main bit lines is selectively connected to one of data lines. In addition, a sensing signal input terminal of a differential amplifier constituting a sensing circuit is connected to a sensing line connected to the data line, and a reference signal input terminal is connected to a reference sensing line. In this way, data read from a memory cell is determined.

In the differential amplifier constituting the sensing circuit, it is difficult to exactly balance a capacitance of the reference sensing line and a capacitance of the sensing line in view of read speed and resistance to noise. Since capacitances are placed at different positions, the differential amplifier is weak against noise and has a limitation in view of an area.

As one of approaches to solving those limitations, the cited document 1 provides a memory cell in which first and second memory cells are arranged, and first and second column trees including line groups through which data of the first and second memory cells are transferred. When the first memory cell is selected, a capacitance balance is obtained by connecting the first column tree to the sensing signal input terminal of the differential amplifier and connecting the second column tree to the reference signal input terminal.

FIG. 2 is a memory block diagram illustrating a memory array configuration obtaining a capacitance balance of an input terminal of a differential amplifier. Referring to FIG. 2, a first column tree is a line group through which data of a first memory cell is transferred. The first column tree includes a first intermediate data line IDL01, main bit lines MBL0-01 and MBL1-01, and bit lines Bi:BL0, Bi:BL1, Bi:BL4, Bi:BL5, Bj:BL0, Bj:BL1, Bj:BL4 and Bj:BL5. Memory cells (not shown) are connected to the bit lines BL.

A second column tree is a line group through which data of another memory cell is transferred. The second column tree includes a second intermediate data line IDL23, main bit lines MBL0-23 and MBL1-23, and bit lines Bi:BL2, Bi:BL3, Bi:BL6, Bi:BL7, Bj:BL2, Bj:BL3, Bj:BL6 and Bj:BL7. Like the first column tree, memory cells (not shown) are connected to the bit lines BL.

When a memory cell inside the first column tree is read, a column switching gate 0101 connects the first column tree and the second column tree, respectively, to a data line DL and a reference data line RDL in response to a first column switching signal SW01. In addition, when a memory cell inside the second column tree is read, the column switching gate 0101 connects the second column tree and the first column tree, respectively, to the data line DL and the reference data line RDL in response to a second column switching signal SW23.

The data line DL is connected to the sensing signal input terminal of the differential amplifier inside the sensing circuit, and the reference data line RDL is connected to the reference signal input terminal. The sensing circuit will be described later. Of the first and second column trees, the column tree including the read-selected memory cell is connected to the data line DL, and the non-selected column tree is connected to the reference data line RDL. Since the first and second column trees have the same configuration, the capacitances of the trees are equal to each other. That is, it is possible to make the capacitance of the data line DL equal to the capacitance of the reference data line RDL.

FIG. 3 is a circuit diagram of a sense amplifier circuit. Referring to FIG. 3, the sense amplifier circuit 200 is a circuit which determines data read through the data line DL and the reference data line RDL of FIG. 2. The sense amplifier circuit 200 includes a separation circuit 50-2 applying a predetermined bias so that the voltage of the data line DL does not exceed a predetermined voltage, a load circuit 30-2 operating as a load between the sensing line SA and the data line DL and between the reference sensing line RSA and the reference data line RDL, a differential amplifier 20 determining read data by amplifying a slight voltage difference between the sensing line SA and the reference sensing line RSA, and an output buffer circuit 10 temporarily storing data determined by the differential amplifier 20.

Gates of separation NMOS transistors 51 and 52 of the separation circuit 50-2 are connected to a bias line BIAS. A source of the NMOS transistor 51 is connected to the reference data line RDL, and a source of the NMOS transistor 52 is connected to the data line DL. Also, the source of the NMOS transistor 51 is connected to a drain of an NMOS transistor 56, and a source of the NMOS transistor 56 is grounded. A gate of the NMOS transistor 56 is connected to a reference voltage signal line VREF. The separation circuit 50-2 includes an NMOS transistor 54 for equalization. Both terminal of the NMOS transistor 54 are connected to NMOS transistors 53 and 55 for capacitance balance, and a gate of the NMOS transistor 54 is connected to an equalization signal line EQ. Sources and drains of the NMOS transistors 53 and 55 for capacitance balance are shorted and connected to the reference data line RDL and the data line DL, respectively. A reference current source (not shown) is connected to the reference data line RDL.

In PMOS transistors 35 to 38 constituting the load of the load circuit 30-2, the PMOS transistor 35 has a source connected to a power supply voltage line VCC, and a gate and a drain connected to a source of the PMOS transistor 36. The PMOS transistor 36 has a gate connected to a load enable signal LOADEN, and a drain connected to the drain of the separation NMOS transistor 51. Likewise, the PMOS transistor 37 has a source connected to the power supply voltage line VCC, and a gate and a drain connected to a source of the PMOS transistor 38. The PMOS transistor 38 has a gate connected to the load enable signal line LOADEN, and a drain connected to the gate of the separation NMOS transistor 52.

A source of a PMOS transistor 31 and a source of a PMOS transistor 33 are connected to the power supply voltage line VCC, and their gates are connected to an enable inversion signal line nEN. A drain of the PMOS transistor 31 is connected to a source of a PMOS transistor 32, and a drain of a PMOS transistor 33 is connected to a source of a PMOS transistor 34. Gates of the PMOS transistors 32 and 34 are connected to a gate of the PMOS transistor 32 to thereby form a mirror circuit, and are connected to the drain of the separation NMOS transistor 51. A drain of the PMOS transistor 34 is connected to the drain of the separation NMOS transistor 52.

The load circuit 30-2 includes an equalization PMOS transistor 40. Both terminals of the equalization PMOS transistor 40 are connected to capacitance balance PMOS transistors 39 and 41, and gates of the equalization PMOS transistor 40 is connected to an equalization inversion signal line nEQ. Sources and drains of the capacitance balance PMOS transistors 39 and 41 are shorted and connected to the drains of the separation NMOS transistors 51 and 52, respectively. The load circuit 30-2 includes capacitance balance PMOS transistors 42 to 44. Sources and drains of the capacitance balance PMOS transistors 42 and 43 are shorted and connected between the drain of the PMOS transistor 36 and the drain of the NMOS transistor 51 and between the drain of the PMOS transistor 38 and the drain of the NMOS transistor 52, and gates of the capacitance balance PMOS transistors 42 and 43 are connected to the drain of the PMOS transistor 38. Likewise, a source and a drain of the PMOS transistor 44 are shorted and connected to the power supply voltage line VCC, and a gate of the PMOS transistor 44 is connected to a connection node of the PMOS transistors 42 and 43.

A PMOS transistor 21 of the differential amplifier 20 has a source connected to the power supply voltage line VCC, and a gate connected to the enable inversion signal line nEN. PMOS transistors 22 and 24 have sources connected to a drain of the PMOS transistor 21, and a gate connected to drains of NMOS transistors 23 and 25. Gates of the PMOS transistors 22 and 24 are connected to the drains of the PMOS transistors 38 and 36 through the sensing line SA and the reference sensing line RSA, respectively. The NMOS transistors 23 and 25 have sources grounded, and gates connected to the drain of the NMOS transistor 25, thereby forming a mirror circuit. The equalization NMOS transistor 26 has a drain and a source connected to the drains of the PMOS transistors 22 and 24, and a gate connected to the equalization signal line EQ.

An input terminal of an inverter 11 of the output buffer circuit 10 is connected to a connection node of the drains of the PMOS transistors 22 and 23, and an output terminal of the inverter 11 is connected to an output signal line nSAOUT.

A read operation will be described below. Referring to FIG. 2, a first column selection decoder 0102 decodes a column selection internal address signal to select and activate one of a plurality of first column selection signals Bi:H0 to Bi:H3 and Bj:H0 to Bj:H3. One of first column gates 0103-Bi:0 and 0103-Bj:1 is turned on, so that one of the bit lines Bi:BL0 to Bi:BL3 and Bj:BL0 to Bj:BL3 is connected to the main bit lines MBL0-01 and MBL0-23. Simultaneously, one of the first column gates 0103-Bi:1 and 0103-Bj:1 is turned on, so that one of the bit lines Bi:BL4 to Bi:BL7 and Bj:BL4 to Bj:BL7 is connected to the main bit lines MBL1-01 and MBL1-23.

A second column selection decoder 0104 decodes a column selection internal address signal to select and activate one of a plurality of second column selection signals D0 and D1. One of the main bit lines MBL0-01 and MBL1-01 is connected to the first intermediate data line IDL01. Simultaneously, one of the main bit lines MBL0-23 and MBL1-23 is connected to the second intermediate data line IDL23.

A column switching selection decoder 0106 decodes the column selection internal address signal to select one of the first column switching signals SW01 and SW23.

When a memory cell inside the first column tree is selected, the switching signal SW01 is high and the switching signal SW23 is low. Therefore, the first intermediate data line IDL01 is connected to the data line DL and simultaneously the second intermediate data line IDL23 is connected to the reference data line RDL.

When a memory cell inside the second column tree is selected, the switching signal SW01 is low and the switching signal SW23 is high. Therefore, the second intermediate data line IDL23 is connected to the data line DL and simultaneously the first intermediate data line IDL01 is connected to the reference data line RDL. That is, the column tree including the read-selected memory cell is connected to the data line DL and data signal of the memory cell is transferred. The non-selected column tree is connected to the reference data line RDL so that the capacitance balance is obtained.

Referring to FIG. 3, a read data signal is received by connecting the source of the separation NMOS transistor 51 of the separation circuit 50-2 to the reference data line RDL, and connecting the source of the separation NMOS transistor 52 to the data line DL. Before receiving the read data signal, the gates of the equalization NMOS transistor 54, the equalization NMOS transistor 40, and the equalization NMOS transistor 20 included in the separation circuit 50-2, the load circuit 30-2, and the differential amplifier 20 receive the equalization signal EQ or the equalization inversion signal nEQ to set a potential of each node to an equal level. In this case, the gate capacitance of the capacitance balance PMOS transistors 42 to 44 are set to be equivalent to the gate capacitance of the PMOS transistors 32 and 34 constituting the mirror circuit, and the capacitance accompanying the load circuit 30-2 is balanced.

When the selected memory cell is an on cell retaining data "1", the read data signal is transferred to the sensing line SA through the data line DL. The reference current source connected to the reference data line RDL is set to half the current amount flowing from the on cell. Thus, the current is amplified while passing through the separation NMOS transistors 51 and 52, so that the sensing line SA becomes a low level and the reference sensing line RSA becomes a high level in the load circuit 30-2. The voltage difference is amplified by the differential amplifier 20 and is output as data "1" through the output buffer circuit 10 to the output signal line nSAOUT.

When the selected memory cell is an off cell retaining data "0", no current flows through the memory cell. Thus, the voltage of the data line DL is higher than that of the reference data line RDL. The voltage is amplified while passing through the separation NMOS transistors 51 and 52, so that the sensing line SA becomes a high level and the reference sensing line RSA becomes a low level in the load circuit 30-2. The voltage difference is amplified by the differential amplifier 20 and is output as data "0" through the output buffer circuit 10 to the output signal line nSAOUT.

In such a structure, however, since the column switching gates 0101 are arranged between the first and second column trees and the sensing circuit 200, independent circuits for the column switching gates are required. Consequently, an additional layout area is also required. That is, the circuit and chip area are increased, leading to increase of design and chip costs.

SUMMARY OF THE INVENTION

The present invention provides a semiconductor storage device including a sensing circuit, which is capable of maximally maintaining a capacitance balance of a sensing line and a reference data line and has a column switching function to suppress increase of a switching circuit and chip area to the minimum.

Embodiments of the present invention provide semiconductor storage devices, including: a plurality of memory cells connected to first and second column trees; and a sensing circuit reading data from the memory cells, wherein the sensing circuit performing a read operation by electrically connecting the column tree, which is connected to a read-selected memory cell, to a sensing node and electrically connecting the column tree, which is connected to a non-selected memory cell, to a reference sensing line.

In some embodiments, the sensing circuit adjusts a balance between a capacitance connected the sensing line and a capacitance connected to the reference sensing line by electrically connecting the first and second column trees to the sensing line and the reference sensing line.

In other embodiments, the sensing circuit electrically connects the first and second column trees, respectively, to the sensing line and the reference sensing line in response to a first control signal.

In still other embodiments, the sensing circuit electrically connects the first and second column trees, respectively, to the reference sensing line and the sensing line in response to a second control signal.

In even other embodiments, the sensing circuit equalizes internal nodes thereof in response to the first and second control signals.

Other embodiments of the present invention provide methods for operating a semiconductor storage device, which includes a plurality of memory cells connected to first and second column trees, and a sensing circuit reading data from the memory cells, the method including: equalizing internal nodes of the sensing circuit in response to first and second control signals; electrically connecting the first and second column trees, respectively, to a sensing line and a reference sensing line of the sensing circuit in response to the first control signal; and electrically connecting the first and second column trees, respectively, to the reference sensing line and the sensing line in response to the second control signal.

In some embodiments, the column tree connected to a read-selected memory cell among the first and second column trees is electrically connected to the sensing line.

In other embodiments, a capacitance connected to the sensing line and a capacitance connected to the reference sensing line are balanced by connecting the first and second column trees to the sensing line and the reference sensing line.

In still other embodiments of the present invention, memory systems include: a semiconductor storage device; and a controller controlling the semiconductor storage device, wherein the semiconductor storage device includes: a plurality of memory cells connected to first and second column trees; and a sensing circuit reading data from the memory cells, wherein the sensing circuit performing a read operation by electrically connecting the column tree, which is connected to a read-selected memory cell, to a sensing node and electrically connecting the column tree, which is connected to a non-selected memory cell, to a reference sensing line.

In some embodiments, the semiconductor storage device and the controller are integrated into a single semiconductor device.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
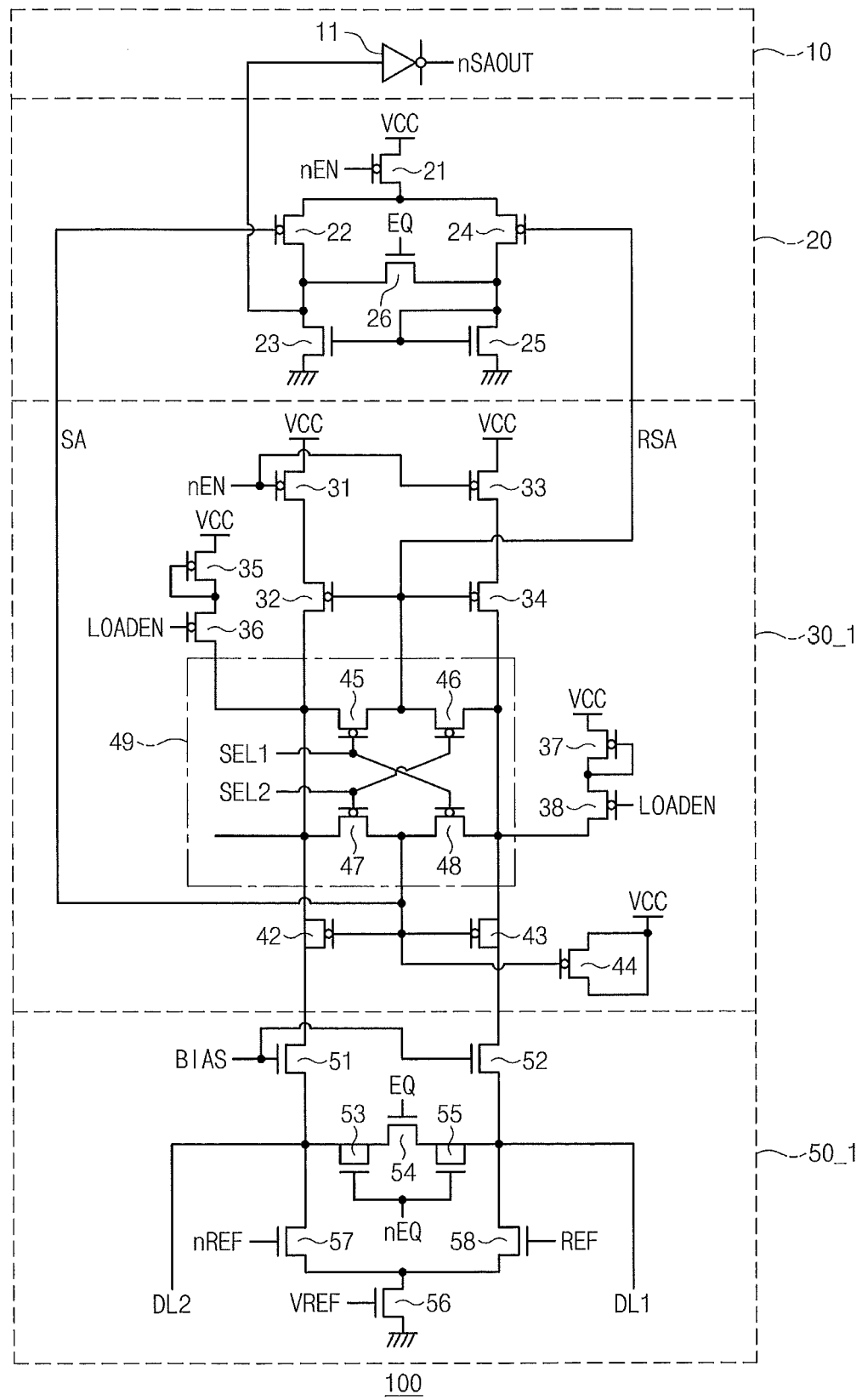
FIG. 1 is a circuit diagram of a sensing circuit according to an embodiment of the present invention.

Hereinafter, exemplary embodiments of the present invention will be described in detail with reference to the accompanying drawings. FIG. 1 is a circuit diagram of a sensing circuit according to an embodiment of the present invention. Referring to FIG. 1, the sensing circuit 100 is a circuit which determines data read through first and second data lines DL1 and DL2 connected to first and second column trees, which will be described below. The sensing circuit 100 includes a separation circuit 50-1 applying a predetermined bias so that the voltage of the first and second data lines DL1 and DL2 do not exceed a predetermined voltage level, a load circuit 30-1 operating as a load between the first data line DL1 and the sensing line SA and between the second data line DL2 and the reference sensing line RSA, a differential amplifier 20 determining read data by amplifying a slight voltage difference between the sensing line SA and the reference sensing line RSA, and an output buffer circuit 10 temporarily storing data determined by the differential amplifier 20.

Figure 2:
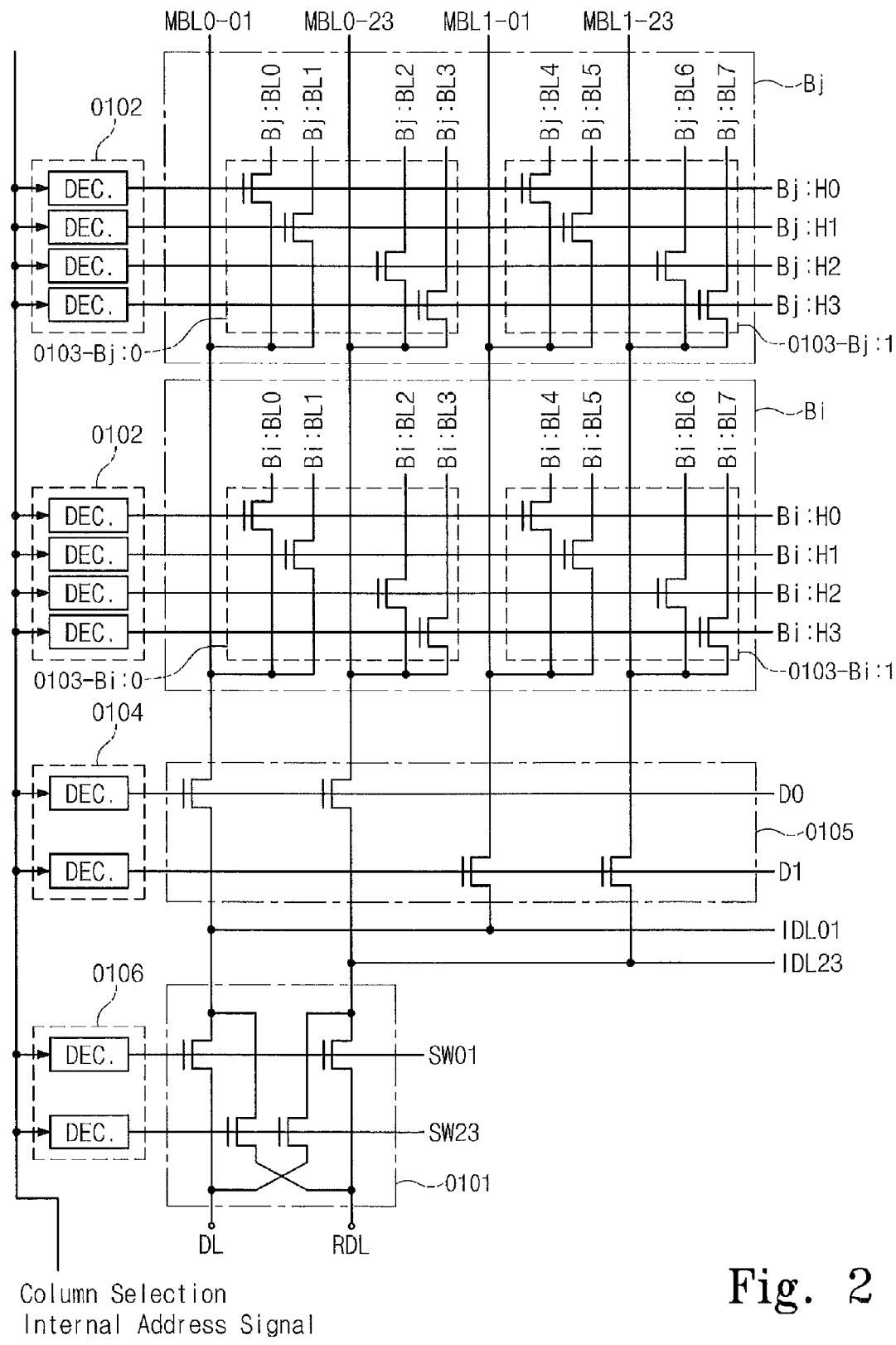
FIG. 2 is a memory block diagram illustrating a memory array configuration obtaining a capacitance balance of an input terminal of a differential amplifier.

According to the embodiment of the present invention, the column switching gate 0101 shown in FIG. 2 is not present. Also, since the same function of the column switching gate 0101 of FIG. 2 is included in the sensing circuit, the reference data line RDL can serve as the data line. Therefore, the first and second column trees are connected to the first data line DL1 and the second data line DL2, respectively. Furthermore, a reference current source (not shown) connected to the reference data line RDL in FIG. 2 is included in the sensing circuit.

Figure 3:
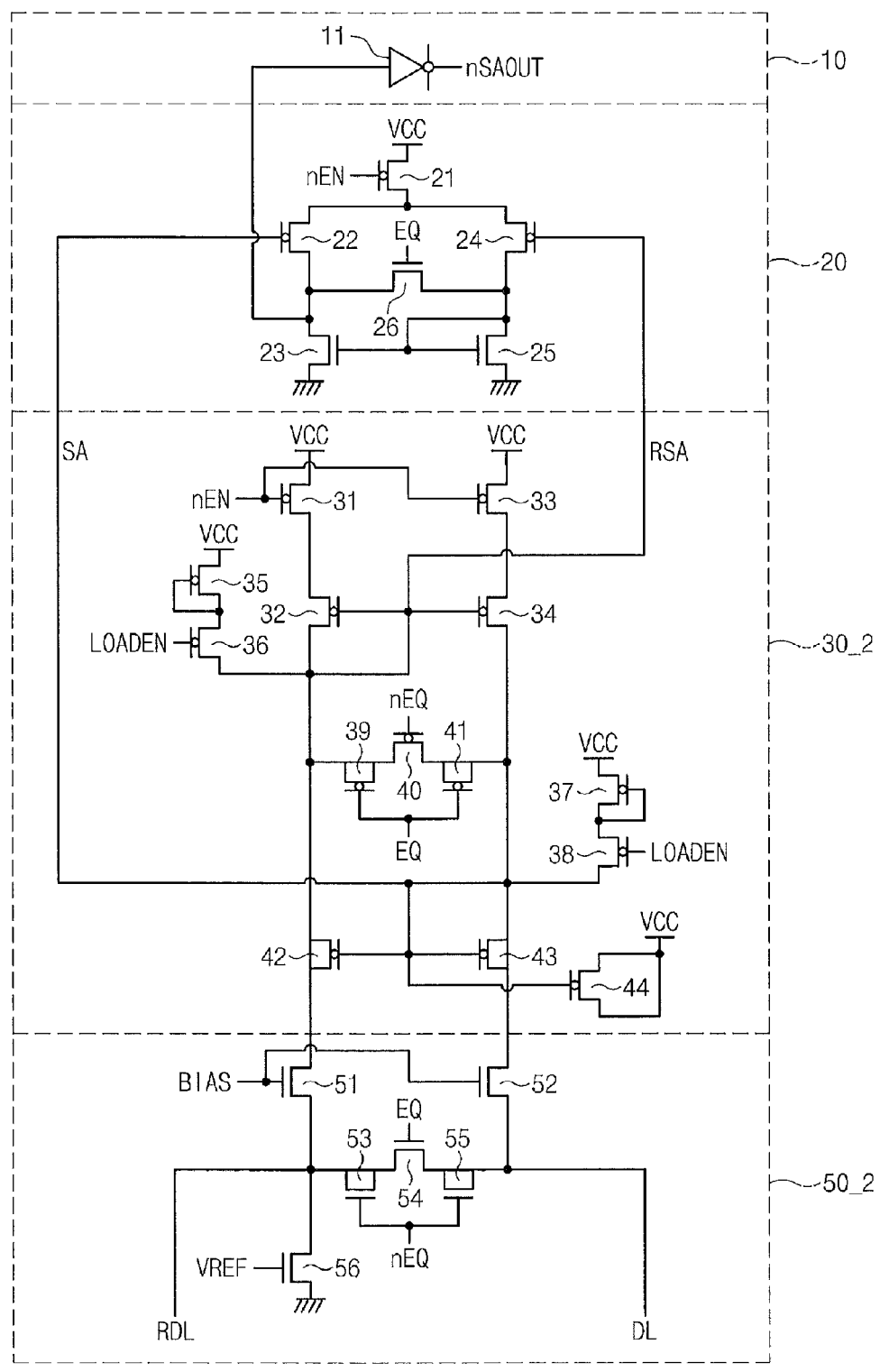
FIG. 3 is a circuit diagram of a sense amplifier circuit.

The separation circuit 50-1 of FIG. 1 differs from the separation circuit 50-2 of FIG. 3 in that NMOS transistors 57 and 58 have drains connected to the second data line DL2 and the first data line DL1, sources connected to a drain of an NMOS transistor 56, and gates connected to a reference inversion signal line nREF and a reference signal line REF.

The load circuit 30-1 of FIG. 1 differs from the load circuit 30-2 of FIG. 3 in that the load circuit 30-1 includes the column switching circuit 49 and the equalization PMOS transistor 40 and the capacitance balance PMOS transistors 39 and 41 of FIG. 3 are not present. Since the differential amplifier 20 and the output buffer circuit 10 are the same as those of FIG. 3, their detailed description will be omitted.

In the column switching circuit 49, one terminal of a first PMOS transistor 45 and one terminal of a second PMOS transistor 46 are connected to the reference sensing line RSA, and one terminal of a third PMOS transistor 47 and one terminal of the fourth PMOS transistor 48 are connected to the sensing line SA. Another terminal of the first PMOS transistor 45 and another terminal of the third PMOS transistor 47 are connected to the second data line DL2, and another terminal of the second PMOS transistor 46 and another terminal of the fourth PMOS transistor 48 are connected to the first data line DL1. Gates of the first PMOS transistor 45 and the fourth PMOS transistor 48 are connected to a first column switching signal line SEL1, and gates of the second PMOS transistor 46 and third PMOS transistor 47 are connected to a second column switching signal line SEL2.

A read operation will be described below. Referring to FIG. 1, sources of separation NMOS transistors 51 and 52 of the separation circuit 50-1 are connected to the second data line DL2 and the first data line DL1 to receive a read data signal. Before receiving the read data signal, gates of equalization NMOS transistors 54 and 26 included in the separation circuit 50-1 and the differential amplifier 20 receive an equalization signal to set each node to an equal level. The equalization operation of the load circuit 30-1 will be described in conjugation with the column switching circuit 49. A gate capacitance of capacitance balance PMOS transistors 42 to 44 is set to be equivalent to a gate capacitance of PMOS transistors 32 and 34 constituting a mirror circuit, and the capacitance accompanying the load circuit 30-1 is balanced.

In a data read operation, when a memory cell of the first column tree is selected, the column switching circuit 49 receives the first column switching signal of a low level from the first column switching signal line SEL1, and receives the second column switching signal of a high level from the second column switching signal line SEL2. Thus, since the first PMOS transistor 45 and the fourth PMOS transistor 48 are turned on, the first data line DL1 is connected to the sensing line SA, and the second data line DL2 is connected to the reference sensing line RSA.

When a memory cell of the second column tree is selected, the column switching circuit 49 receives the first column switching signal of a high level from the first column switching signal line SEL1, and receives the second column switching signal of a low level from the second column switching signal line SEL2. Thus, since the second PMOS transistor 46 and the third PMOS transistor 47 are turned on, the first data line DL1 is connected to the reference sensing line RSA, and the second data line DL2 is connected to the sensing line SA.

In this way, the data line of the selected column tree is always connected to the sensing line SA and the data line of the non-selected column tree is connected to the reference sensing line RSA, regardless of whether the selected memory cell retains data "1" or data "0". Thus, the capacitance balance of the sensing line SA and the reference sensing line RSA is equally maintained.

Therefore, the read data signal is transferred to the sensing line SA through the data lines DL1 and DL2 and the separation NMOS transistors 51 and 52, regardless of whether the data of the memory cell is "1" or "0". A reference current source (not shown) is connected to the reference current source, and the reference current source (not shown) is set to half the current amount flowing from the on cell. Thus, when the read data signal of data "1" is input to the load circuit 30-1, the sensing line SA becomes a low level and the reference sensing line RSA becomes a high level. When the read data signal of data "0" is input to the load circuit 30-1, the sensing line SA becomes a high level and the reference sensing line RSA becomes a low level. The voltage difference is amplified by the differential amplifier 20 and is output as data "1" or data "0" through the output buffer circuit 10 to the output signal line nSAOUT.

Upon equalization operation, the column switching circuit 49 receives the equalization signals of a low level from the first column switching signal line SEL1 and the second column switching signal line SEL2 at the same time to thereby turn on the PMOS transistors 45 to 48. Therefore, the voltages at all nodes of the load circuit 30-1 are set to the equal voltage level.

As described above, since the column switching circuit included in the load circuit of the sensing circuit operates as the equalization circuit, it is possible to maintain the capacitance balances of the sensing line and the reference sensing line at the maximum and suppress the increase of devices necessary for selection at the minimum. Thus, the increase of circuit and chip area can be suppressed at the minimum. Consequently, the semiconductor storage device can perform the high-speed read operation robust against noise.

In summary, the semiconductor storage device according to the embodiment of the present invention includes the first and second column trees having the bit lines and the intermediate data lines, and the sensing circuit reading the memory cells connected to the first and second column trees. The sensing circuit performs the read operation by electrically connecting the first or second column tree, which is connected to the read-selected memory cell, to the sensing line, and connecting the first or second column, which is connected to the non-selected memory cell, to the reference sensing line. Therefore, the balance of the capacitance connected to the sensing line and the balance of the capacitance connected to the reference sensing line are adjusted.

Furthermore, the sensing circuit electrically connects the first column tree and the second column tree to the sensing line and the reference sensing line in response to the first control signal, respectively, electrically connects the first column tree and the second column tree to the reference sensing line and the sensing line in response to the second control signal, respectively, and equalizes the internal nodes in response to the first and second control signals.

Figure 4:
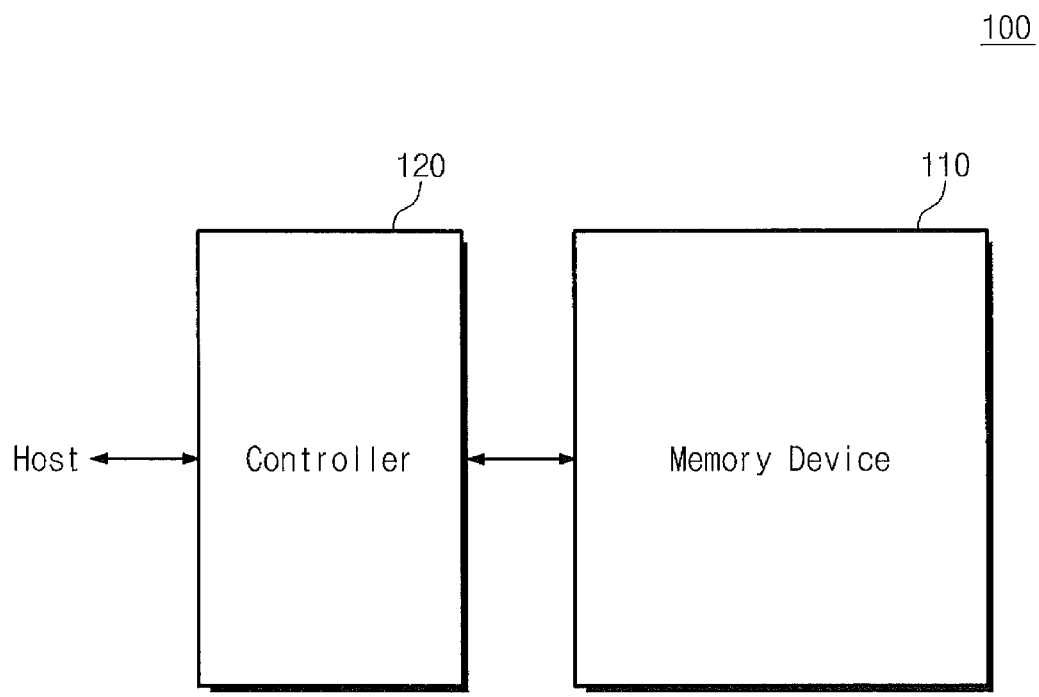
FIG. 4 is a block diagram of a memory system according to an embodiment of the present invention.

FIG. 4 is a block diagram of a memory system 100 according to an embodiment of the present invention. Referring to FIG. 4, the memory system 100 according to the embodiment of the present invention includes a memory device 110 and a controller 120.

The controller 120 is connected to a host and the memory device 110. The controller 110 transfers data read from the memory device 120 to the host, and stores data transferred from the host in the memory device 110.

The controller 120 may include well-known components such as a RAM, a processing unit, a host interface, and a memory interface. The RAM is used as a working memory of the processing unit. The processing unit controls an overall operation of the controller 120. The host interface may include a protocol for data exchange between the host and the controller 120. For example, the controller 120 may be configured to communicate with an external host through one of various interface protocols, such as USB, MMC, PCI-E, Advanced Technology Attachment (ATA), Serial-ATA, Parallel-ATA, SCSI, ESDI, and Integrated Drive Electronics (IDE). The memory interface interfaces with the memory device 110. The controller 120 may further include an error correction block. The error correction block detects and corrects error of data read from the memory device 110.

As illustrated in FIG. 2, the memory device 110 includes first and second column trees having bit lines connected to memory cells, main bit lines connected to the bit lines, and intermediate data lines connected to the main bit lines. Furthermore, the memory device 110 may further include a sensing circuit of FIG. 1 in order to read memory cells connected to the first and second column trees.

The controller 120 and the memory device 110 may be integrated into a single semiconductor device. For example, the controller 120 and the memory device 110 may be integrated into a single semiconductor device to constitute a memory card. Also, the controller 120 and the memory device 110 may be integrated into a single semiconductor device to constitute a PC card (PCMCIA), a compact flash card (CF), a smart media card (SM/SMC), a memory stick, a multimedia card (MMC, RS-MMC, MMCmicro), an SD card (SD, miniSD, microSD), or an universal flash storage (UFS).

As another example, the controller 120 and the memory device 110 may be integrated into a single memory device to constitute a semiconductor disk/drive (SSD, solid state Disk/Drive). When the memory system 100 is used as a semiconductor disk (SSD), the operation speed of the host connected to the memory system 100 will be remarkably enhanced.

As another example, the memory system 100 may be applied to a PDA, a portable computer, a web tablet, a wireless phone, a mobile phone, a digital music player, or devices capable of transmitting/receiving data in a wireless environment.

The memory device 110 according to the embodiment of the present invention may be implemented in various forms. For example, it can be understood that the memory device 110 may be implemented with nonvolatile memory devices such as ROM, PROM, EPROM, EEPROM, flash memory devices, PRAM, MRAM, RRAM, and FRAM.

Figure 5:
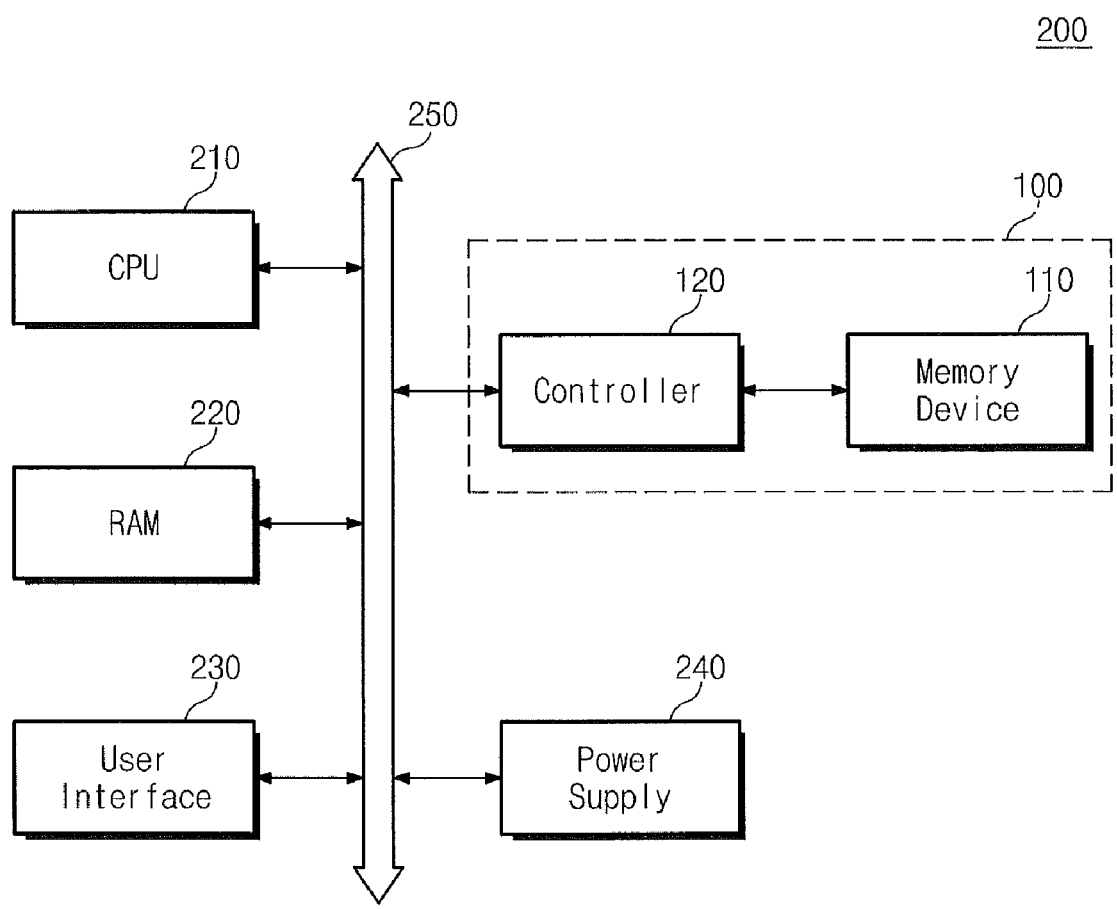
FIG. 5 is a block diagram of a computing system including the memory system of FIG. 4 according to an embodiment of the present invention.

FIG. 5 is a block diagram of a computing system 200 including the memory system 100 of FIG. 4 according to an embodiment of the present invention. Referring to FIG. 5, the computing system 200 according to the embodiment of the present invention includes a central processing unit 210, a random access memory (RAM) 220, a user interface 230, a power supply 240, and a memory system 100.

The memory system 100 is electrically connected to the central processing unit 210, the RAM 220, the user interface 230, and the power supply 240 through a system bus 250. Data provided through the user interface 230 or processed by the central processing unit 210 are stored in the memory system 100. The memory system 100 includes a controller 120 and a nonvolatile memory device 110.

Although the memory device 110 constitutes the memory system 100 with the controller 120 and is connected to the system bus 250, the present invention is not limited thereto. For example, it will be understood that the memory device 110 of FIG. 4 may also be provided as the RAM 220 of the computing system 200.

According to the embodiments of the present invention, since the column switching circuit included in the sensing circuit operates as the equalization circuit, the increase of circuit and chip area can be suppressed to the minimum, and the semiconductor storage device can perform the high-speed read operation robust against noise.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor storage device, comprising:
a plurality of memory cells connected to first and second column trees; and
a sensing circuit reading data from the memory cells,
wherein the sensing circuit performs a read operation for a selected one of the memory cells,
wherein the sensing circuit performs the read operation by electrically connecting the column tree that is connected to the read-selected memory cell to a sensing line and electrically connecting the column tree that is connected to a non-selected memory cell to a reference sensing line,
wherein the sensing circuit electrically connects the first and second column trees, respectively, to the sensing line and the reference sensing line in response to a first control signal,
wherein the sensing circuit electrically connects the first and second column trees, respectively, to the reference sensing line and the sensing line in response to a second control signal, and
wherein the sensing circuit equalizes voltages at internal nodes thereof in response to the first and second control signals.

2. The semiconductor storage device of claim 1, wherein the sensing circuit adjusts a balance between a capacitance connected the sensing line and a capacitance connected to the reference sensing line by electrically connecting the first and second column trees to the sensing line and the reference sensing line.

3. A method for operating a semiconductor storage device including a plurality of memory cells connected to first and second column trees, and a sensing circuit reading data from the memory cells, the method comprising:
Equalizing voltages at internal nodes of the sensing circuit in response to first and second control signals;
electrically connecting the first and second column trees, respectively, to a sensing line and a reference sensing line of the sensing circuit in response to the first control signal; and
electrically connecting the first and second column trees, respectively, to the reference sensing line and the sensing line in response to the second control signal.

4. The method of claim 3, wherein the sensing circuit performs a read operation for a selected one of the memory cells, and
wherein the column tree connected to the read-selected memory cell is electrically connected to the sensing line.

5. The method of claim 3, wherein a capacitance connected to the sensing line and a capacitance connected to the reference sensing line are balanced by connecting the first and second column trees to the sensing line and the reference sensing line.

6. A memory system comprising:
a semiconductor storage device; and
a controller controlling the semiconductor storage device,
wherein the semiconductor storage device comprises:
a plurality of memory cells connected to first and second column trees; and
a sensing circuit reading data from the memory cells,
wherein the sensing circuit performs a read operation for a selected one of the memory cells,
wherein the sensing circuit performs the read operation by electrically connecting the column tree that is connected to the read-selected memory cell to a sensing line and electrically connecting the column tree that is connected to a non-selected memory cell to a reference sensing line, wherein the sensing circuit electrically connects the first and second column trees, respectively, to the sensing line and the reference sensing line in response to a first control signal, wherein the sensing circuit electrically connects the first and second column trees, respectively, to the reference sensing line and the sensing line in response to a second control signal, and wherein the sensing circuit equalizes voltages at internal nodes thereof in response to the first and second control signals.

7. The memory system of claim 6, wherein the semiconductor storage device and the controller are integrated into a single semiconductor device.

8. The semiconductor storage device of claim 1, wherein the sensing circuit includes a separation circuit applying a predetermined bias so that a voltage of first and second data lines connected to the first and second column trees, respectively, does not exceed a predetermined voltage.

9. The semiconductor storage device of claim 8, wherein the separation circuit is connected to a reference inversion signal line and a reference signal line.

10. The method of claim 3, wherein the sensing circuit includes a separation circuit applying a predetermined bias so that a voltage of first and second data lines connected to the first and second column trees, respectively, does not exceed a predetermined voltage.

11. The method of claim 10, wherein the separation circuit is connected to a reference inversion signal line and a reference signal line.

12. The memory system of claim 6, wherein the sensing circuit includes a separation circuit applying a predetermined bias so that a voltage of first and second data lines connected to the first and second column trees, respectively, does not exceed a predetermined voltage.

13. The memory system of claim 12, wherein the separation circuit is connected to a reference inversion signal line and a reference signal line.

* * * * *